(12) United States Patent
Hua et al.

(10) Patent No.: US 10,410,979 B2
(45) Date of Patent: Sep. 10, 2019

(54) STRUCTURE FOR REDUCING COMPOUND SEMICONDUCTOR WAFER DISTORTION

(71) Applicant: WIN Semiconductors Corp., Tao Yuan (TW)

(72) Inventors: Chang-Hwang Hua, Tao Yuan (TW); Wen Chu, Tao Yuan (TW)

(73) Assignee: WIN SEMICONDUCTORS CORP., Tao Yuan (TW)

(*) Notice: Subject to any disclaimer, the term of this patent is extended or adjusted under 35 U.S.C. 154(b) by 0 days.

(21) Appl. No.: 15/962,474

(22) Filed: Apr. 25, 2018

(65) Prior Publication Data

US 2018/0366418 A1 Dec. 20, 2018

Related U.S. Application Data

(63) Continuation-in-part of application No. 15/684,482, filed on Aug. 23, 2017, now Pat. No. 10,158,212.

(30) Foreign Application Priority Data

Jun. 14, 2017 (TW) .............................. 106119865 A (51) Int. Cl.
*H01L 23/00* (2006.01)
*H01L 29/45* (2006.01)
(Continued)

(52) U.S. Cl.
CPC .......... *H01L 23/562* (2013.01); *H01L 23/373* (2013.01); *H01L 29/45* (2013.01); *H01L 29/452* (2013.01); *H01L 33/12* (2013.01); *H01L 33/40* (2013.01); *H01S 5/0206* (2013.01); *H01S 5/02476* (2013.01); *H01S 5/0425* (2013.01); *H01S 5/3201* (2013.01); *H01S 5/3406* (2013.01); *H01L 29/1608* (2013.01); *H01L 29/20* (2013.01); *H01L 29/22* (2013.01); *H01L 29/24* (2013.01);
(Continued)

(58) Field of Classification Search
CPC ... H01L 23/562; H01L 23/373; H01L 23/367; H01L 29/45; H01S 5/0206; H01S 5/02476; H01S 5/0425; H01S 5/3201; H01S 5/3406; H01S 5/18311; H01S 5/18344; H01S 5/187; H01S 2301/173
See application file for complete search history.

(56) References Cited

U.S. PATENT DOCUMENTS

2004/0191534 A1    9/2004  Ravi
2011/0079894 A1*   4/2011  Markunas ............... H01L 24/11
                                                    257/737

(Continued)

*Primary Examiner* — Armando Rodriguez
(74) *Attorney, Agent, or Firm* — Muncy, Geissler, Olds & Lowe, P.C.

(57) ABSTRACT

An improved structure for reducing compound semiconductor wafer distortion comprises a contact metal layer and at least one stress balance layer. The contact metal layer is formed on a bottom surface of a compound semiconductor wafer; the at least one stress balance layer is formed on a bottom surface of the contact metal layer, wherein a thermal conductivity of the at least one stress balance layer is greater than or equal to 10 W/m-K. The stress suffered by the compound semiconductor wafer is balanced by the at least one stress balance layer, so that the distortion of the compound semiconductor wafer is reduced.

33 Claims, 4 Drawing Sheets

(51) Int. Cl.
  *H01S 5/024* (2006.01)
  *H01S 5/042* (2006.01)
  *H01S 5/02* (2006.01)
  *H01S 5/34* (2006.01)
  *H01L 23/373* (2006.01)
  *H01S 5/32* (2006.01)
  *H01L 33/12* (2010.01)
  *H01L 33/40* (2010.01)
  *H01S 5/183* (2006.01)
  *H01S 5/187* (2006.01)
  *H01L 23/367* (2006.01)
  *H01L 29/861* (2006.01)
  *H01L 29/866* (2006.01)
  *H01L 29/872* (2006.01)
  *H01L 29/16* (2006.01)
  *H01L 29/20* (2006.01)
  *H01L 29/22* (2006.01)
  *H01L 29/24* (2006.01)

(52) U.S. Cl.
  CPC ........ *H01L 29/861* (2013.01); *H01L 29/866* (2013.01); *H01L 29/872* (2013.01); *H01L 2933/0016* (2013.01); *H01S 5/187* (2013.01); *H01S 5/18311* (2013.01); *H01S 5/18344* (2013.01); *H01S 2301/173* (2013.01)

(56) References Cited

U.S. PATENT DOCUMENTS

2011/0165439 A1* 7/2011 Nishimori ............ G11B 5/7315
                                                    428/836
2012/0138945 A1  6/2012 Chen et al.
2015/0004778 A1  1/2015 Botula et al.
2018/0082960 A1* 3/2018 Bellotti ............ H01L 21/32051

* cited by examiner

STRUCTURE FOR REDUCING COMPOUND SEMICONDUCTOR WAFER DISTORTION

CROSS-REFERENCE TO RELATED DOCUMENTS

This application is a Continuation-in-Part of co-pending application Ser. No. 15/684,482, filed on Aug. 23, 2017, for which priority is claimed under 35 U.S.C. § 120; and this application claims priority of Application No. 106119865 filed in Taiwan on Jun. 14, 2017 under 35 U.S.C. § 119; the entire contents of all of which are hereby incorporated by reference.

FIELD OF THE INVENTION

The present invention relates to an improved structure for reducing the distortion of the compound semiconductor wafer, especially an improved structure for balancing the stress suffered by the compound semiconductor wafer.

BACKGROUND OF THE INVENTION

During the process of forming integrated circuits on a compound semiconductor wafer, more or less stress is accumulated such that the compound semiconductor wafer is suffered a stress. In some certain situation, the compound semiconductor wafer is suffered greater stress, such as forming a stressed thin film on the compound semiconductor wafer or growing a stressed epitaxial structure on the compound semiconductor wafer. If the stress suffered by the compound semiconductor wafer cannot be properly balanced, then it will cause bowing distortion of the compound semiconductor wafer. Even further it will crack the edge of the compound semiconductor wafer. Moreover, after the compound semiconductor wafer thinning process, since the compound semiconductor wafer becomes thinner so that it is more difficult for balancing the stress suffered by the compound semiconductor wafer. Therefore, the bowing distortion of the compound semiconductor wafer becomes more serious and even further causes the cracking of the edge of the compound semiconductor wafer.

In terms of the diameters of the compound semiconductor wafers, the bowing distortion of the compound semiconductor wafer caused by the stress is less obvious when the diameter of the compound semiconductor wafer is less than 3 inches, while the bowing distortion of the compound semiconductor wafer caused by the stress is much more significant when the diameter of the compound semiconductor wafer is greater than or equal to 3 inches, such as 4 inches, 5 inches, 6 inches or even greater.

Figure 3:
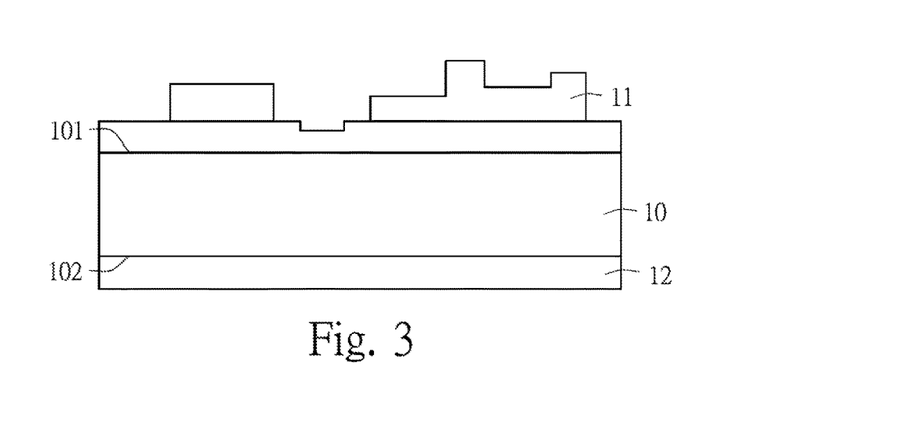
FIG. 3 is a sectional schematic view of an improved structure for silicon semiconductor wafer of conventional technology.

In conventional technology, an improved structure is disclosed for balancing the stress suffered by the silicon semiconductor wafer. Please refer to FIG. 3, which is a sectional schematic view of an improved structure for silicon semiconductor wafer of conventional technology. An integrated circuit 11 is formed on a top surface 101 of a silicon semiconductor wafer 10. A stress balance layer 12 is formed on a bottom surface 102 of the silicon semiconductor wafer 10 for balancing the stress which is accumulated during the process of forming the integrated circuit 11 and suffered by the silicon semiconductor wafer 10.

In the application of compound semiconductor devices, growing multiple layers of epitaxial structure is needed during the formation of the integrated circuits on the compound semiconductor wafer. Comparing to forming silicon based integrated circuits on a silicon semiconductor wafer, usually the compound semiconductor wafer is suffered much more stress than the silicon semiconductor wafer. However, the conventional technology does not disclose the stress balance structure which can effectively balance the stress suffered by a compound semiconductor wafer. Furthermore, for some certain application of compound semiconductor devices, it is required to form a metal layer or to form an ohmic electrode on a bottom surface of a compound semiconductor wafer. The improved structure for silicon semiconductor wafer of the conventional technology could not meet the requirement.

Moreover, for some certain application of compound semiconductor devices, especially for high power devices, the heat dissipation is a very important issue. The heat generated by high power devices has to be dissipated. Therefore, when the improved structure for reducing compound semiconductor wafer distortion (including the balancing the stress layer) is designed to be formed on the bottom of the compound semiconductor wafer, a better design of the balancing the stress layer is required to have a high thermal conductivity such that the heat can be dissipated through the bottom of the compound semiconductor wafer to a package substrate.

Accordingly, the present invention has developed a new design which could avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is: how to form an improved structure which comprises at least one stress balance layer and a contact metal layer on a bottom surface of a compound semiconductor wafer so that the improved structure has both the functions of stress balance and heat dissipation.

In order to solve the problems mentioned the above and to achieve the expected effect, the present invention provides an improved structure for reducing compound semiconductor wafer distortion, which comprises a contact metal layer and at least one stress balance layer. The contact metal layer is formed on a bottom surface of a compound semiconductor wafer. The at least one stress balance layer formed on a bottom surface of the contact metal layer, wherein a thermal conductivity of the at least one stress balance layer is greater than or equal to 10 W/m-K. The stress suffered by the compound semiconductor wafer is balanced by the at least one stress balance layer, so that the distortion of the compound semiconductor wafer is reduced.

In an embodiment of the improved structure for reducing compound semiconductor wafer distortion, wherein a die attachment layer formed on a bottom surface of the at least one stress balance layer.

In an embodiment of the improved structure for reducing compound semiconductor wafer distortion, wherein the at least one stress balance layer is made of at least one nonconductive material.

In an embodiment of the improved structure for reducing compound semiconductor wafer distortion, wherein the at least one stress balance layer is made by at least one material selected from the group consisting of: AlN, SiC, ITO, diamond and InP.

In an embodiment of the improved structure for reducing compound semiconductor wafer distortion, wherein the at least one stress balance layer is formed on the bottom surface of the contact metal layer by sputtering, PVD, PECVD, CVD or ALD.

In an embodiment of the improved structure for reducing compound semiconductor wafer distortion, wherein each of the at least one stress balance layer is made by at least one material selected from the group consisting of: Ti or Ti alloy, W or W alloy, Au or Au alloy, TiW alloy, TiWN alloy, WN alloy, Al or Al alloy, Cu or Cu alloy, Fe or Fe alloy, Sn or Sn alloy, Mg or Mg alloy, brass, graphite, Pb, Ni, Ag, stainless steel, Cr, Co, Mo, monel, Pd, Pt, Rh, Ru, Ta, Zn and Nb.

In an embodiment of the improved structure for reducing compound semiconductor wafer distortion, wherein the at least one stress balance layer is formed on the bottom surface of the contact metal layer by sputtering, electroplating, PVD, PECVD, CVD or ALD.

In an embodiment of the improved structure for reducing compound semiconductor wafer distortion, wherein the at least one stress balance layer has a thickness greater than or equal to 50 nm and less than or equal to 5000 nm.

In an embodiment of the improved structure for reducing compound semiconductor wafer distortion, wherein the contact metal layer is made by at least one material selected from the group consisting of: Pd, Ge, Ni, Ti, Pt, Au, Zr, Hf, V, Nb, Ta, Cr, Mo, W, Mn, Fe, Co, Ru, Rh, Cu, Al, Zn, In, Sn, Sb, Mg, Pb, Ag, TiW alloy and TiWN alloy.

In an embodiment of the improved structure for reducing compound semiconductor wafer distortion, wherein the contact metal layer has a thickness greater than or equal to 10 nm and less than or equal to 1000 nm.

In an embodiment of the improved structure for reducing compound semiconductor wafer distortion.

In an embodiment of the improved structure for reducing compound semiconductor wafer distortion, wherein the die attachment layer is made by at least one material selected from the group consisting of: Au or Au alloy, Ag or Ag alloy, Sn or Sn alloy, and silver conductive epoxy adhesive.

In an embodiment of the improved structure for reducing compound semiconductor wafer distortion, further comprising an epitaxial structure, wherein the epitaxial structure is formed on a top surface of the compound semiconductor wafer.

In an embodiment of the improved structure for reducing compound semiconductor wafer distortion, wherein the compound semiconductor wafer is made by one material selected from the group consisting of: GaAs, sapphire, InP, GaP, SiC, GaN, AlN, ZnSe, InAs, and GaSb.

In an embodiment of the improved structure for reducing compound semiconductor wafer distortion, wherein the compound semiconductor wafer has a thickness greater than or equal to 25 μm and less than or equal to 350 μm.

In an embodiment of the improved structure for reducing compound semiconductor wafer distortion, wherein the compound semiconductor wafer has a diameter greater than or equal to 3 inches.

For further understanding the characteristics and effects of the present invention, some preferred embodiments referred to drawings are in detail described as follows.

DETAILED DESCRIPTIONS OF PREFERRED EMBODIMENTS

Figure 1:
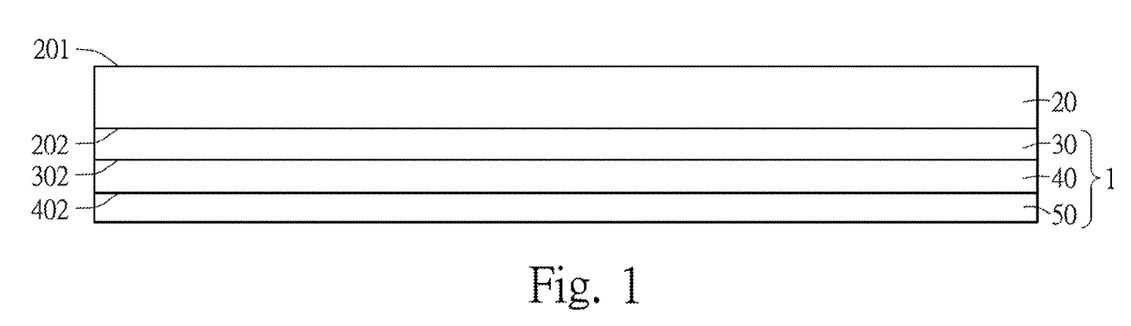
FIG. 1 is a sectional schematic view of an embodiment of an improved structure for reducing compound semiconductor wafer distortion of the present invention.

Please refer to FIG. 1, which is a sectional schematic view of an embodiment of an improved structure for reducing compound semiconductor wafer distortion of the present invention. The improved structure 1 for reducing compound semiconductor wafer distortion of the present invention comprises a contact metal layer 30, at least one stress balance layer 40 and a die attachment layer 50. The contact metal layer 30 is formed on a bottom surface 202 of a compound semiconductor wafer 20, wherein the compound semiconductor wafer 20 has a top surface 201 and the bottom surface 202. The material of the compound semiconductor wafer 20 may be one selected from the group consisting of: GaAs, sapphire, InP, GaP, SiC, GaN, AlN, ZnSe, InAs, and GaSb. The compound semiconductor wafer 20 has a thickness greater than or equal to 25 μm and less than or equal to 350 μm. In some preferable embodiments, the compound semiconductor wafer 20 has a diameter greater than or equal to 3 inches. Since the larger diameter of the compound semiconductor wafer 20 will cause the distortion of the compound semiconductor wafer 20 more seriously. Therefore, the effect of reducing the distortion of the compound semiconductor wafer 20 is more significant when the improved structure 1 for reducing compound semiconductor wafer distortion of the present invention is applied to the compound semiconductor wafer 20 which has a diameter greater than or equal to 3 inches. The material of the contact metal layer 30 is at least one selected from the group consisting of: Pd, Ge, Ni, Ti, Pt, Au, and Ag. The stress balance layer 40 is formed on a bottom surface 302 of the contact metal layer 30. The stress balance layer 40 is made of at least one conductive material. The stress balance layer 40 is formed on the bottom surface 302 of the contact metal layer 30 by sputtering, electroplating, vacuum evaporation, ion plating or chemical vapor deposition. In some preferable embodiments, the stress balance layer 40 is formed on the bottom surface 302 of the contact metal layer 30 by sputtering or electroplating. The stress balance layer 40 has a thickness greater than or equal to 50 nm and less than or equal to 5 μm. In some preferable embodiments, a thermal conductivity of the stress balance layer 40 is greater than or equal to 10 W/m-K. In some embodiments, the material of each of the at least one stress balance layer 40 is metal or metal alloy. In some preferable embodiments, the material of each of the at least one stress balance layer 40 is at least one selected from the group consisting of: Ti or Ti alloy, W or W alloy, Au or Au alloy, TiW alloy, TiWN alloy, and WN alloy. The die attachment layer 50 is formed on a bottom surface 402 of the stress balance layer 40. The die attachment layer 50 is made of conductive material. The material of the die attachment layer 50 is at least one selected from the group consisting of: Au or Au alloy, Ag or Ag alloy, Sn or Sn alloy, and silver conductive epoxy adhesive. By locating the at least one stress balance layer 40 between the contact metal layer 30 and the die attachment layer 50, the stress suffered by the compound semiconductor wafer 20 is balanced so that the distortion of the compound semiconductor wafer 20 is reduced. Since the contact metal layer 30, the stress balance layer 40 and the die attachment layer 50 are all made of conductive materials, therefore the improved structure 1 for reducing compound semiconductor wafer distortion of the present invention not only can balance the stress suffered by the compound semiconductor wafer 20 to reduce the distortion of the compound semiconductor wafer 20, but the improved structure 1 also have the function of conducting to meet the requirements of some specific applications. According to the stress suffered by the compound semiconductor wafer 20, the improved structure 1 for reducing compound semiconductor wafer distortion of the present invention may choose appropriate materials and thicknesses (including the contact metal layer 30, the stress balance layer 40 and the die attachment layer 50) to balance the stress of the structure formed on the top surface 201 of the compound semiconductor wafer 20.

In some preferable embodiments, the material of the compound semiconductor wafer 20 is one selected from the group consisting of: GaAs, sapphire, InP, GaP, SiC, GaN and AlN. In some preferable embodiments, the material of the contact metal layer 30 is at least one selected from the group consisting of: Pd, Ge, Ni, Ti, Pt, Au, and Ag. In some preferable embodiments, the material of each of the at least one stress balance layer 40 is at least one selected from the group consisting of: Ti or Ti alloy, W or W alloy, Au or Au alloy and TiW alloy. In some preferable embodiments, the material of the die attachment layer 50 is Au or Au alloy.

In some preferable embodiments, the thickness of the compound semiconductor wafer 20 is greater than or equal to 25 μm and less than or equal to 350 μm, greater than or equal to 35 μm and less than or equal to 350 μm, greater than or equal to 50 μm and less than or equal to 350 μm, greater than or equal to 75 μm and less than or equal to 350 μm, greater than or equal to 100 μm and less than or equal to 350 μm, greater than or equal to 25 μm and less than or equal to 300 μm, greater than or equal to 25 μm and less than or equal to 250 μm, greater than or equal to 25 μm and less than or equal to 200 μm, greater than or equal to 25 μm and less than or equal to 150 μm, or greater than or equal to 25 μm and less than or equal to 100 μm. In some preferable embodiments, the thickness of the stress balance layer 40 is greater than or equal to 50 nm and less than or equal to 5 μm, greater than or equal to 75 nm and less than or equal to 5 μm, greater than or equal to 100 nm and less than or equal to 5 μm, greater than or equal to 150 nm and less than or equal to 5 μm, greater than or equal to 200 nm and less than or equal to 5 μm, greater than or equal to 250 nm and less than or equal to 5 μm, greater than or equal to 50 nm and less than or equal to 4.5 μm, greater than or equal to 50 nm and less than or equal to 4 μm, greater than or equal to 50 nm and less than or equal to 3.5 μm, or greater than or equal to 50 nm and less than or equal to 3 μm.

Figure 2A:
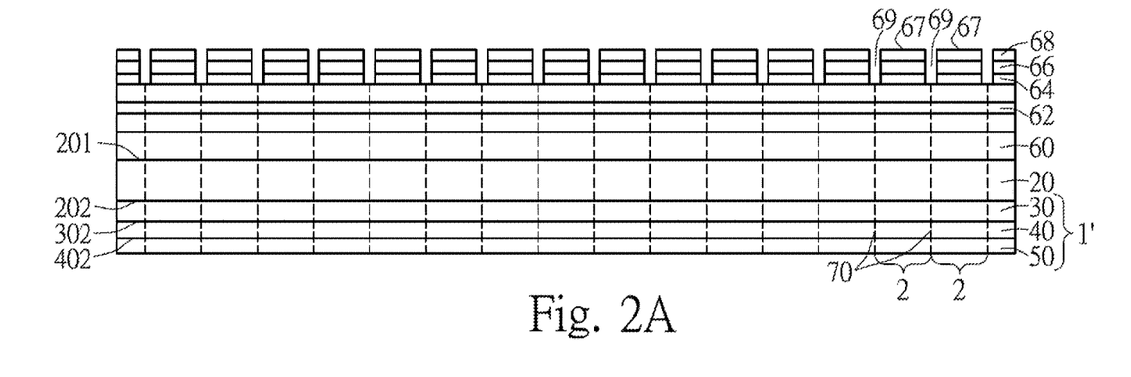
FIG. 2A is a sectional schematic view of an application of an improved structure for reducing compound semiconductor wafer distortion of the present invention to vertical-cavity surface-emitting laser diodes.
Figure 2B:
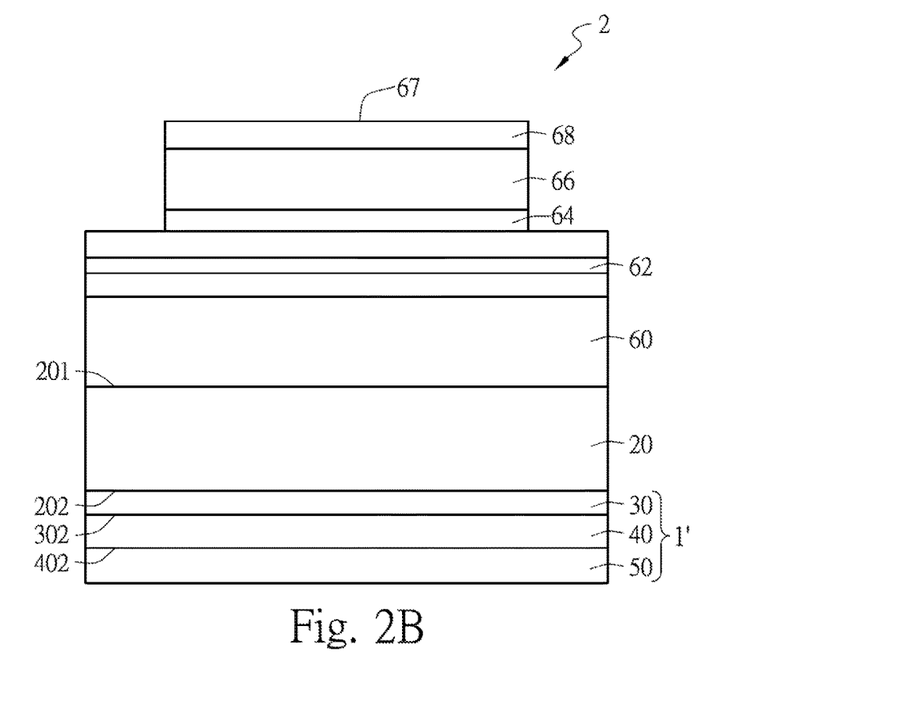
FIG. 2B is a sectional schematic view of an application of an improved structure for reducing compound semiconductor wafer distortion of the present invention to a vertical-cavity surface-emitting laser diode.

Please refer to FIG. 2A, which is a sectional schematic view of an application of an improved structure for reducing compound semiconductor wafer distortion of the present invention to vertical-cavity surface-emitting laser diodes, wherein the improved structure 1' for reducing compound semiconductor wafer distortion of the present invention is applied to form a plurality of vertical-cavity surface-emitting laser diodes 2. In the embodiment of FIG. 2A, the improved structure 1' for reducing compound semiconductor wafer distortion of the present invention comprises a contact metal layer 30, at least one stress balance layer 40 and a die attachment layer 50. The contact metal layer 30 is formed on a bottom surface 202 of a compound semiconductor wafer 20. The stress balance layer 40 is formed on a bottom surface 302 of the contact metal layer 30. The die attachment layer 50 is formed on a bottom surface 402 of the stress balance layer 40. The improved structure 1' for reducing compound semiconductor wafer distortion of embodiment of FIG. 2A is basically the same as the improved structure 1 of the embodiment of FIG. 1, except that an ohmic contact is formed between the contact metal layer 30 and the bottom surface 202 of the compound semiconductor wafer 20 so that the contact metal layer 30 forms an ohmic electrode. In current embodiment, the ohmic electrode is an n-type ohmic electrode. In the embodiment of FIG. 2A, it further comprises: an n-type distributed Bragg reflector 60, a quantum well structure 62, an oxidation confinement layer 64, a p-type distributed Bragg reflector 66, a p-type ohmic electrode 68, a plurality of mesa structures 67 and a plurality of recesses 69. The n-type distributed Bragg reflector 60 is formed on a top surface 201 of the compound semiconductor wafer 20. The quantum well structure 62 is formed on the n-type distributed Bragg reflector 60. The oxidation confinement layer 64 is formed on the quantum well structure 62. The p-type distributed Bragg reflector 66 is formed on the oxidation confinement layer 64. The p-type ohmic electrode 68 is formed on the p-type distributed Bragg reflector 66. The plurality of recesses 69 is formed by etching the p-type ohmic electrode 68, the p-type distributed Bragg reflector 66 and the oxidation confinement layer 64 within the area of the plurality of recesses 69. Thereby the plurality of mesa structures 67 is formed. Each mesa structure 67 includes the p-type ohmic electrode 68, the p-type distributed Bragg reflector 66 and the oxidation confinement layer 64. Please also refer to FIG. 2B, which is a sectional schematic view of an application of an improved structure for reducing compound semiconductor wafer distortion of the present invention to a vertical-cavity surface-emitting laser diode. By cutting the structure of FIG. 2A along the dashed lines 70, a plurality of vertical-cavity surface-emitting laser diodes 2 as shown in FIG. 2B is produced. Each vertical-cavity surface-emitting laser diode 2 comprises the die attachment layer 50, the stress balance layer 40, the contact metal layer 30 (n-type ohmic electrode), the compound semiconductor wafer 20, the n-type distributed Bragg reflector 60, the quantum well structure 62, the oxidation confinement layer 64, the p-type distributed Bragg reflector 66, the p-type ohmic electrode 68 and one mesa structure 67.

In some embodiments, the improved structure 1' for reducing compound semiconductor wafer distortion of the present invention (an ohmic contact is formed between the contact metal layer 30 and the bottom surface 202 of the compound semiconductor wafer 20 so that the contact metal layer 30 forms an ohmic electrode), the ohmic electrode formed by the contact metal layer 30 may be applied to the vertical-cavity surface-emitting laser diode 2 as shown in FIG. 2A and besides may also be applied to at least one selected from the group consisting of: a PN diode, a Schottky diode, a light-emitting diode, a laser diode, a photodiode, a varicap diode, a current regulative diode, and a Zener diode.

Figure 4A:
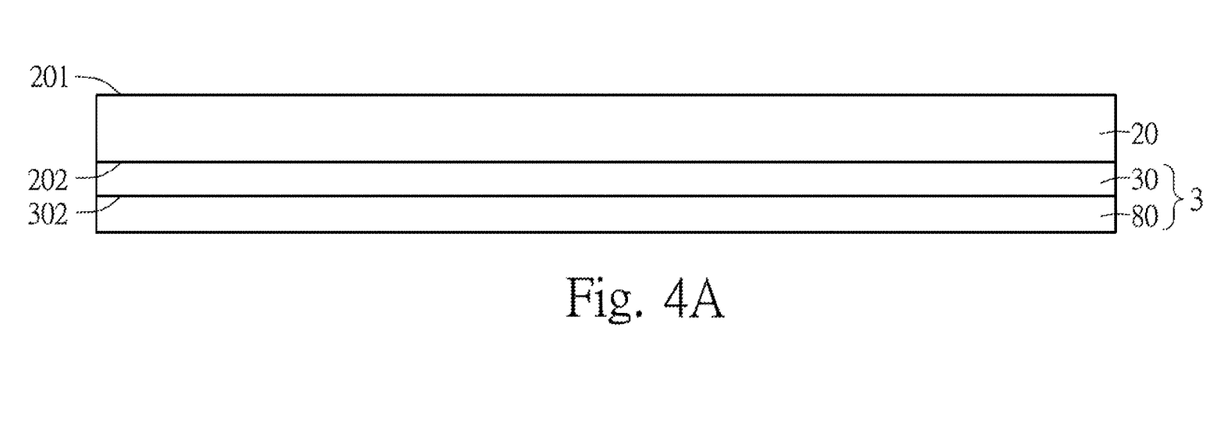
FIG. 4A is a sectional schematic view of an embodiment of an improved structure for reducing compound semiconductor wafer distortion of the present invention.

Please refer to FIG. 4A, which is a sectional schematic view of an embodiment of an improved structure for reducing compound semiconductor wafer distortion of the present invention. The improved structure 3 for reducing compound semiconductor wafer distortion of the present invention comprises a contact metal layer 30 and at least one stress balance layer 80. The contact metal layer 30 is formed on a bottom surface 202 of a compound semiconductor wafer 20, wherein the compound semiconductor wafer 20 has a top surface 201 and the bottom surface 202. The material of the compound semiconductor wafer 20 may be one selected from the group consisting of: GaAs, sapphire, InP, GaP, SiC, GaN, AlN, ZnSe, InAs, and GaSb. The compound semiconductor wafer 20 has a thickness greater than or equal to 25 µm and less than or equal to 350 µm. In some preferable embodiments, the compound semiconductor wafer 20 has a diameter greater than or equal to 3 inches. Since the larger diameter of the compound semiconductor wafer 20 will cause the distortion of the compound semiconductor wafer 20 more seriously. Therefore, the effect of reducing the distortion of the compound semiconductor wafer 20 is more significant when the improved structure 3 for reducing compound semiconductor wafer distortion of the present invention is applied to the compound semiconductor wafer 20 which has a diameter greater than or equal to 3 inches. The material of the contact metal layer 30 is at least one selected from the group consisting of: Pd, Ge, Ni, Ti, Pt, Au, Zr, Hf, V, Nb, Ta, Cr, Mo, W, Mn, Fe, Co, Ru, Rh, Cu, Al, Zn, In, Sn, Sb, Mg, Pb, Ag, TiW alloy and TiWN alloy. In a preferable embodiment, the contact metal layer 30 has a thickness greater than or equal to 10 nm and less than or equal to 1000 nm. The stress balance layer 80 is formed on a bottom surface 302 of the contact metal layer 30. In a preferable embodiment, the stress balance layer 80 has a thickness greater than or equal to 50 nm and less than or equal to 5000 nm. The stress suffered by the compound semiconductor wafer 20 is balanced by the stress balance layer 80, so that the distortion of the compound semiconductor wafer 20 is reduced. According to the stress suffered by the compound semiconductor wafer 20, the improved structure 3 for reducing compound semiconductor wafer 20 distortion of the present invention may choose appropriate materials and thicknesses (including the contact metal layer 30 and the stress balance layer 80) to balance the stress suffered the compound semiconductor wafer 20. Furthermore, the improved structure 3 for reducing compound semiconductor wafer distortion of the present invention requires that the stress balance layer 80 must have a thermal conductivity of is greater than or equal to W/m-K. Therefore, the improved structure 3 for reducing compound semiconductor wafer distortion of the present invention (including the contact metal layer 30 and the at least one stress balance layer 80) may provide both the functions of stress balance and heat dissipation.

In some embodiments, the stress balance layer 80 is made of at least one nonconductive material. In some preferable embodiments, the stress balance layer 80 is made by at least one material selected from the group consisting of: AlN, SiC, ITO, diamond and InP. The stress balance layer 80 is formed on the bottom surface 302 of the contact metal layer 30 by sputtering, PVD, PECVD, CVD or ALD.

In some other embodiments, the stress balance layer 80 is made of metal or metal alloy. In some preferable embodiments, the stress balance layer 80 is made by at least one material selected from the group consisting of: Ti or Ti alloy, W or W alloy, Au or Au alloy, TiW alloy, TiWN alloy, WN alloy, Al or Al alloy, Cu or Cu alloy, Fe or Fe alloy, Sn or Sn alloy, Mg or Mg alloy, brass, graphite, Pb, Ni, Ag, stainless steel, Cr, Co, Mo, monel, Pd, Pt, Rh, Ru, Ta, Zn and Nb. The stress balance layer 80 is formed on the bottom surface 302 of the contact metal layer 30 by sputtering, electroplating, PVD, PECVD, CVD or ALD.

Figure 4B:
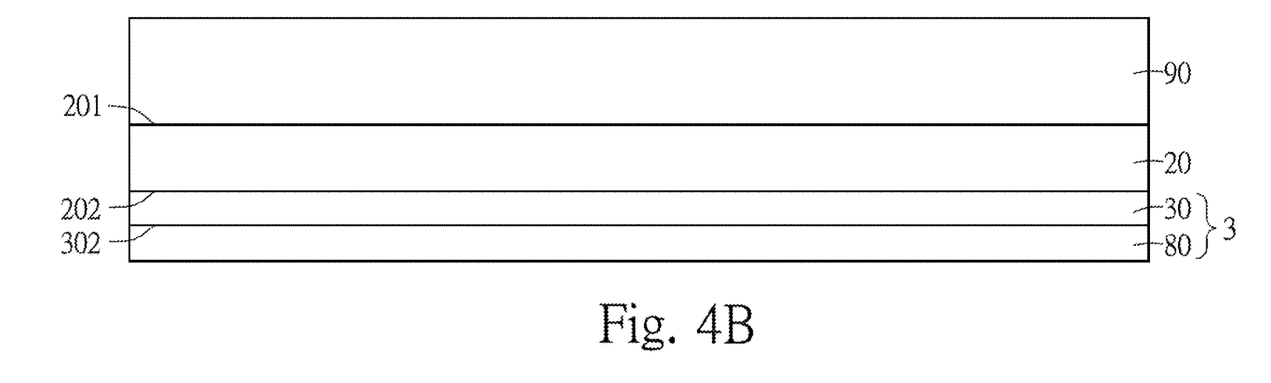
FIG. 4B is a sectional schematic view of another embodiment of an improved structure for reducing compound semiconductor wafer distortion of the present invention.

Please refer to FIG. 4B, which is a sectional schematic view of another embodiment of an improved structure for reducing compound semiconductor wafer distortion of the present invention. The main structure of the embodiment of FIG. 4B is basically the same as the structure of the embodiment of FIG. 4A, except that it further comprises an epitaxial structure 90. The epitaxial structure 90 is formed on the top surface 201 of the compound semiconductor wafer 20. The stress suffered by the compound semiconductor wafer 20 and the epitaxial structure 90 is balanced by the stress balance layer 80, so that the distortion of the compound semiconductor wafer 20 is reduced. According to the stress suffered by the compound semiconductor wafer 20 and the epitaxial structure 90, the improved structure 3 for reducing compound semiconductor wafer distortion of the present invention may choose appropriate materials and thicknesses (including the contact metal layer 30 and the stress balance layer 80) to balance the stress suffered the compound semiconductor wafer 20 and the epitaxial structure 90.

Figure 5A:
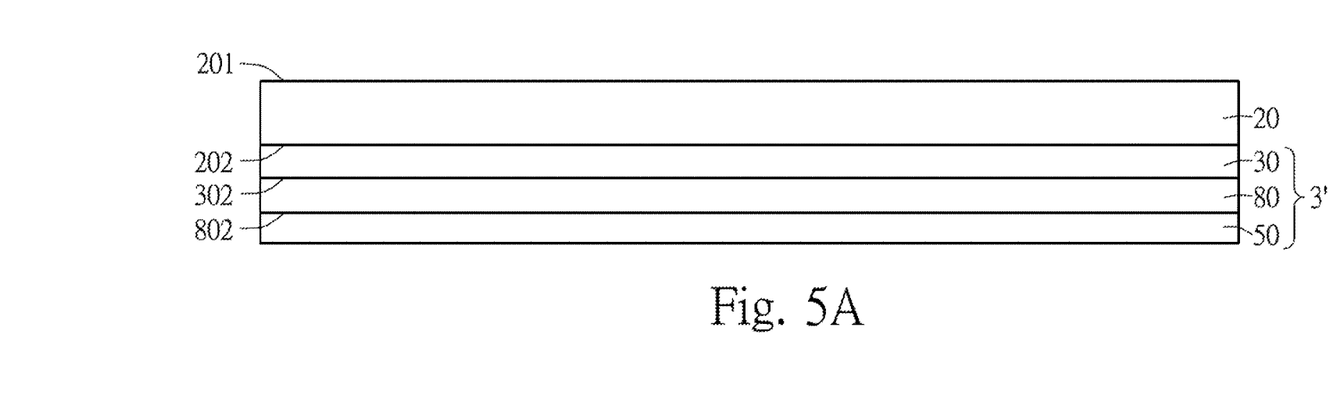
FIG. 5A is a sectional schematic view of an embodiment of an improved structure for reducing compound semiconductor wafer distortion of the present invention.

Please refer to FIG. 5A, which is a sectional schematic view of an embodiment of an improved structure for reducing compound semiconductor wafer distortion of the present invention. The improved structure 3' for reducing compound semiconductor wafer distortion of the present invention comprises a contact metal layer 30, at least one stress balance layer 80 and a die attachment layer 50. The contact metal layer 30 is formed on a bottom surface 202 of a compound semiconductor wafer 20, wherein the compound semiconductor wafer 20 has a top surface 201 and the bottom surface 202. The material of the compound semiconductor wafer 20 may be one selected from the group consisting of: GaAs, sapphire, InP, GaP, SiC, GaN, AlN, ZnSe, InAs, and GaSb. In a preferable embodiment, the compound semiconductor wafer 20 has a thickness greater than or equal to 25 µm and less than or equal to 350 µm. In some preferable embodiments, the compound semiconductor wafer 20 has a diameter greater than or equal to 3 inches. Since the larger diameter of the compound semiconductor wafer 20 will cause the distortion of the compound semiconductor wafer 20 more seriously. Therefore, the effect of reducing the distortion of the compound semiconductor wafer 20 is more significant when the improved structure 3' for reducing compound semiconductor wafer distortion of the present invention is applied to the compound semiconductor wafer 20 which has a diameter greater than or equal to 3 inches. The material of the contact metal layer 30 is at least one selected from the group consisting of: Pd, Ge, Ni, Ti, Pt, Au, Zr, Hf, V, Nb, Ta, Cr, Mo, W, Mn, Fe, Co, Ru, Rh, Cu, Al, Zn, In, Sn, Sb, Mg, Pb, Ag, TiW alloy and TiWN alloy. In a preferable embodiment, the contact metal layer 30 has a thickness greater than or equal to 10 nm and less than or equal to 1000 nm. The stress balance layer 80 is formed on a bottom surface 302 of the contact metal layer 30. In a preferable embodiment, the stress balance layer 80 has a thickness greater than or equal to 50 nm and less than or equal to 5000 nm. In some embodiments, the stress balance layer 80 is made of at least one nonconductive material. In some preferable embodiments, the stress balance layer 80 is made by at least one material selected from the group consisting of: AlN, SiC, ITO, diamond and InP. The stress balance layer 80 is formed on the bottom surface 302 of the contact metal layer 30 by sputtering, PVD, PECVD, CVD or ALD. The die attachment layer 50 is formed on a bottom surface 802 of the stress balance layer 80. The die attachment layer 50 is made of conductive material. The material of the die attachment layer 50 is at least one selected from the group consisting of: Au or Au alloy, Ag or Ag alloy, Sn or Sn alloy, and silver conductive epoxy adhesive. By locating the at least one stress balance layer 80 between the contact metal layer 30 and the die attachment layer 50, the stress suffered by the compound semiconductor wafer 20 is balanced so that the distortion of the compound semiconductor wafer 20 is reduced. According to the stress suffered by the compound semiconductor wafer 20, the improved structure 3' for reducing compound semiconductor wafer distortion of the present invention may choose appropriate materials and thicknesses (including the contact metal layer 30, the stress balance layer 80 and the die attachment layer 50) to balance the stress of the structure formed on the top surface 201 of the compound semiconductor wafer 20. Furthermore, the improved structure 3' for reducing compound semiconductor wafer distortion of the present invention requires that the stress balance layer 80 must have a thermal conductivity of is greater than or equal to 10 W/m-K. Therefore, the improved structure 3' for reducing compound semiconductor wafer distortion of the present invention (including the contact metal layer 30, the at least one stress balance layer 80 and the die attachment layer 50) may provide both the functions of stress balance and heat dissipation.

Figure 5B:
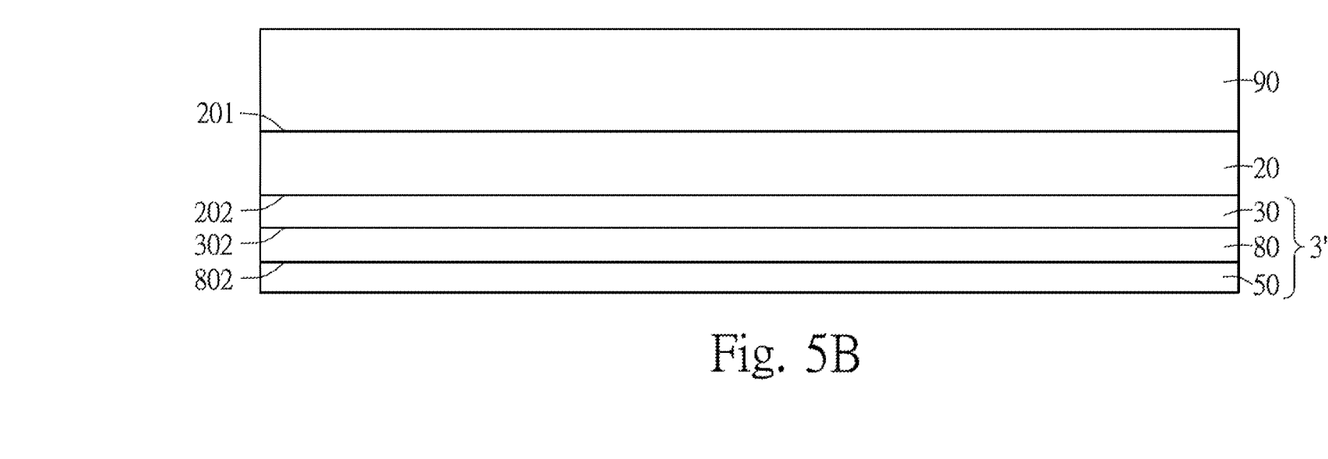
FIG. 5B is a sectional schematic view of another embodiment of an improved structure for reducing compound semiconductor wafer distortion of the present invention.

Please refer to FIG. 5B, which is a sectional schematic view of another embodiment of an improved structure for reducing compound semiconductor wafer distortion of the present invention. The main structure of the embodiment of FIG. 5B is basically the same as the structure of the embodiment of FIG. 5A, except that it further comprises an epitaxial structure 90. The epitaxial structure 90 is formed on the top surface 201 of the compound semiconductor wafer 20. The stress suffered by the compound semiconductor wafer 20 and the epitaxial structure 90 is balanced by locating the at least one stress balance layer 80 between the contact metal layer 30 and the die attachment layer 50, so that the distortion of the compound semiconductor wafer 20 and the epitaxial structure 90 is reduced. According to the stress suffered by the compound semiconductor wafer 20 and the epitaxial structure 90, the improved structure 3' for reducing compound semiconductor wafer distortion of the present invention may choose appropriate materials and thicknesses (including the contact metal layer 30, the stress balance layer 80 and the die attachment layer 50) to balance the stress suffered the compound semiconductor wafer 20 and the epitaxial structure 90.

In the embodiments of FIGS. 4A, 4B, 5A and 5B, the thickness of the stress balance layer 80 is greater than or equal to 50 nm and less than or equal to 5000 nm, greater than or equal to 75 nm and less than or equal to 5000 nm, greater than or equal to 100 nm and less than or equal to 5000 nm, greater than or equal to 150 nm and less than or equal to 5000 nm, greater than or equal to 200 nm and less than or equal to 5000 nm, greater than or equal to 250 nm and less than or equal to 5000 nm, greater than or equal to 50 nm and less than or equal to 4500 nm, greater than or equal to 50 nm and less than or equal to 4000 nm, greater than or equal to 50 nm and less than or equal to 3500 nm, or greater than or equal to 50 nm and less than or equal to 3000 nm.

In the embodiments of FIGS. 4A, 4B, 5A and 5B, the thickness of the compound semiconductor wafer 20 is greater than or equal to 25 µm and less than or equal to 350 µm, greater than or equal to 35 µm and less than or equal to 350 µm, greater than or equal to 50 µm and less than or equal to 350 µm, greater than or equal to 75 µm and less than or equal to 350 µm, greater than or equal to 100 µm and less than or equal to 350 µm, greater than or equal to 25 µm and less than or equal to 300 m, greater than or equal to 25 µm and less than or equal to 250 µm, greater than or equal to 25 µm and less than or equal to 200 µm, greater than or equal to 25 µm and less than or equal to 150 µm, or greater than or equal to 25 µm and less than or equal to 100 µm.

As disclosed in the above description and attached drawings, the present invention can provide an improved structure for reducing compound semiconductor wafer distortion. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. An improved structure for reducing compound semiconductor wafer distortion, comprising:
   a contact metal layer formed on a bottom surface of a compound semiconductor wafer;
   at least one stress balance layer formed on a bottom surface of said contact metal layer, wherein a thermal conductivity of said at least one stress balance layer is greater than or equal to 10 W/m-K; and
   a die attachment layer formed on a bottom surface of said at least one stress balance layer;
   wherein the stress suffered by said compound semiconductor wafer is balanced by said at least one stress balance layer, so that the distortion of said compound semiconductor wafer is reduced.

2. The improved structure for reducing compound semiconductor wafer distortion according to claim 1, wherein said contact metal layer is made by at least one material selected from the group consisting of: Pd, Ge, Ni, Ti, Pt, Au, Zr, Hf, V, Nb, Ta, Cr, Mo, W, Mn, Fe, Co, Ru, Rh, Cu, Al, Zn, In, Sn, Sb, Mg, Pb, Ag, TiW alloy and TiWN alloy.

3. The improved structure for reducing compound semiconductor wafer distortion according to claim 1, wherein said contact metal layer has a thickness greater than or equal to 10 nm and less than or equal to 1000 nm.

4. The improved structure for reducing compound semiconductor wafer distortion according to claim 1, wherein said at least one stress balance layer is made of at last one electrically nonconductive material.

5. The improved structure for reducing compound semiconductor wafer distortion according to claim 4, wherein said at least one stress balance layer is made by at least one material selected from the group consisting of: AlN, SiC, ITO, diamond and InP.

6. The improved structure for reducing compound semiconductor wafer distortion according to claim 1, wherein said at least one stress balance layer has a thickness greater than or equal to 50 nm and less than or equal to 5000 nm.

7. The improved structure for reducing compound semiconductor wafer distortion according to claim 1, wherein said at least one stress balance layer is formed on said bottom surface of said contact metal layer by sputtering, PVD, PECVD, CVD or ALD.

8. The improved structure for reducing compound semiconductor wafer distortion according to claim 1, wherein said die attachment layer is made by at least one material selected from the group consisting of: Au or Au alloy, Ag or Ag alloy, Sn or Sn alloy, and silver conductive epoxy adhesive.

9. The improved structure for reducing compound semiconductor wafer distortion according to claim 1, further comprising an epitaxial structure, wherein said epitaxial structure is formed on a top surface of said compound semiconductor wafer.

10. An improved structure for reducing compound semiconductor wafer distortion, comprising:
 a contact metal layer formed on a bottom surface of a compound semiconductor wafer; and
 at least one stress balance layer formed on a bottom surface of said contact metal layer, wherein a thermal conductivity of said at least one stress balance layer is greater than or equal to 10 W/m-K, wherein said at least one stress balance layer is made of at least one electrically nonconductive material;
 wherein the stress suffered by said compound semiconductor wafer is balanced by said at least one stress balance layer, so that the distortion of said compound semiconductor wafer is reduced.

11. The improved structure for reducing compound semiconductor wafer distortion according to claim 10, wherein said at least one stress balance layer is made by at least one material selected from the group consisting of: AlN, SiC, ITO, diamond and InP.

12. The improved structure for reducing compound semiconductor wafer distortion according to claim 10, wherein said at least one stress balance layer is formed on said bottom surface of said contact metal layer by sputtering, PVD, PECVD, CVD or ALD.

13. The improved structure for reducing compound semiconductor wafer distortion according to claim 10, wherein said at least one stress balance layer has a thickness greater than or equal to 50 nm and less than or equal to 5000 nm.

14. The improved structure for reducing compound semiconductor wafer distortion according to claim 10, wherein said contact metal layer is made by at least one material selected from the group consisting of: Pd, Ge, Ni, Ti, Pt, Au, Zr, Hf, V, Nb, Ta, Cr, Mo, W, Mn, Fe, Co, Ru, Rh, Cu, Al, Zn, In, Sn, Sb, Mg, Pb, Ag, TiW alloy and TiWN alloy.

15. The improved structure for reducing compound semiconductor wafer distortion according to claim 10, wherein said contact metal layer has a thickness greater than or equal to 10 nm and less than or equal to 1000 nm.

16. The improved structure for reducing compound semiconductor wafer distortion according to claim 10, further comprising an epitaxial structure, wherein said epitaxial structure is formed on a top surface of said compound semiconductor wafer.

17. An improved structure for reducing compound semiconductor wafer distortion, comprising:
 a contact metal layer formed on a bottom surface of a compound semiconductor wafer; and
 at least one stress balance layer formed on a bottom surface of said contact metal layer, wherein a thermal conductivity of said at least one stress balance layer is greater than or equal to 10 W/m-K, wherein each of said at least one stress balance layer is made by at least one material selected from the group consisting of: Au or Au alloy, WN alloy, AlCu alloy, Fe alloy, Sn or Sn alloy, Mg or Mg alloy, brass, graphite, stainless steel, monel, Pt, Zn and Nb;
 wherein the stress suffered by said compound semiconductor wafer is balanced by said at least one stress balance layer, so that the distortion of said compound semiconductor wafer is reduced.

18. The improved structure for reducing compound semiconductor wafer distortion according to claim 17, wherein said at least one stress balance layer is formed on said bottom surface of said contact metal layer by sputtering, electroplating, PVD, PECVD, CVD or ALD.

19. The improved structure for reducing compound semiconductor wafer distortion according to claim 17, wherein said at least one stress balance layer has a thickness greater than or equal to 50 nm and less than or equal to 5000 nm.

20. The improved structure for reducing compound semiconductor wafer distortion according to claim 17, wherein said contact metal layer is made by at least one material selected from the group consisting of: Zr, Hf, V, Nb, W, Mn, Fe, Co, Ru, Rh, Cu, Zn, In, Sn, Sb, Mg, Pb, TiW alloy and TiWN alloy.

21. The improved structure for reducing compound semiconductor wafer distortion according to claim 17, wherein said contact metal layer has a thickness greater than or equal to 10 nm and less than or equal to 1000 nm.

22. The improved structure for reducing compound semiconductor wafer distortion according to claim 17, further comprising an epitaxial structure, wherein said epitaxial structure is formed on a top surface of said compound semiconductor wafer.

23. The improved structure for reducing compound semiconductor wafer distortion according to claim 17, wherein said compound semiconductor wafer is made by one material selected from the group consisting of: GaAs, sapphire, InP, GaP, SiC, GaN, IAN, ZnSe, InAs, and GaSb.

24. The improved structure for reducing compound semiconductor wafer distortion according to claim 17, wherein said compound semiconductor wafer has a thickness greater than or equal to 25 μm and less than or equal to 350 μm.

25. The improved structure for reducing compound semiconductor wafer distortion according to claim 17, wherein said compound semiconductor wafer has a diameter greater than or equal to 3 inches.

26. The improved structure for reducing compound semiconductor wafer distortion according to claim 1, wherein said compound semiconductor wafer is made by one material selected from the group consisting of: GaAs, sapphire, InP, GaP, SiC, GaN, AlN, ZnSe, InAs, and GaSb.

27. The improved structure for reducing compound semiconductor wafer distortion according to claim 1, wherein said compound semiconductor wafer has a thickness greater than or equal to 25 μm and less than or equal to 350 μm.

28. The improved structure for reducing compound semiconductor wafer distortion according to claim 1, wherein said compound semiconductor wafer has a diameter greater than or equal to 3 inches.

29. The improved structure for reducing compound semiconductor wafer distortion according to claim 10, wherein said compound semiconductor wafer is made by one material selected from the group consisting of: GaAs, sapphire, InP, GaP, SiC, GaN, AlN, ZnSe, InAs, and GaSb.

30. The improved structure for reducing compound semiconductor wafer distortion according to claim 10, wherein said compound semiconductor wafer has a thickness greater than or equal to 25 μm and less than or equal to 350 μm.

31. The improved structure for reducing compound semiconductor wafer distortion according to claim 10, wherein said compound semiconductor wafer has a diameter greater than or equal to 3 inches.

32. The improved structure for reducing compound semiconductor wafer distortion according to claim 17, wherein said contact metal layer is made by at least one material selected from the group consisting of: Pd, Ge, Ni, Ti, Pt, Au, Ta, Cr, Mo, Al, and Ag.

33. An improved structure for reducing compound semiconductor wafer distortion, comprising:
- a contact metal layer formed on a bottom surface of a compound semiconductor wafer, wherein said contact metal layer is made by at least one material selected from the group consisting of: Zr, Hf, V, Nb, W, Mn, Fe, Co, Ru, Rh, Cu, Zn, In, Sn, Sb, Mg, Pb, TiW alloy and TiWN alloy; and
- at least one stress balance layer formed on a bottom surface of said contact metal layer, wherein a thermal conductivity of said at least one stress balance layer is greater than or equal to 10 W/m-K, wherein each of said at least one stress balance layer is made of TiWN alloy.

* * * * *